United States Patent
Aue et al.

(10) Patent No.: US 10,133,491 B2
(45) Date of Patent: Nov. 20, 2018

(54) METHOD AND APPARATUS FOR UPDATING A CONTROL DEVICE

(71) Applicant: Robert Bosch GmbH, Stuttgart (DE)

(72) Inventors: Axel Aue, Korntal-Muenchingen (DE); Hans-Walter Schmitt, Weissach/Flacht (DE); Matthias Schreiber, Vaihngen/Enz (DE)

(73) Assignee: ROBERT BOSCH GMBH, Stuttgart (DE)

( * ) Notice: Subject to any disclaimer, the term of this patent is extended or adjusted under 35 U.S.C. 154(b) by 90 days.

(21) Appl. No.: 15/284,632

(22) Filed: Oct. 4, 2016

(65) Prior Publication Data
US 2017/0102875 A1   Apr. 13, 2017

(30) Foreign Application Priority Data
Oct. 13, 2015 (DE) .................... 10 2015 219 841

(51) Int. Cl.
  *G06F 3/06* (2006.01)
  *G11C 16/10* (2006.01)
  *G11C 16/22* (2006.01)

(52) U.S. Cl.
  CPC ............ *G06F 3/061* (2013.01); *G06F 3/0655* (2013.01); *G06F 3/0688* (2013.01); *G11C 16/105* (2013.01); *G11C 16/225* (2013.01)

(58) Field of Classification Search
  CPC ...... G06F 3/061; G06F 3/0655; G06F 3/0688; G11C 16/105; G11C 16/225
  See application file for complete search history.

(56) References Cited

U.S. PATENT DOCUMENTS

2006/0069849 A1* 3/2006 Rudelic ............... G06F 12/0246
                                                           711/103

FOREIGN PATENT DOCUMENTS

DE    10 2011 117376 A1    5/2012

* cited by examiner

*Primary Examiner* — Reginald G Bragdon
*Assistant Examiner* — Mehdi Namazi
(74) *Attorney, Agent, or Firm* — Norton Rose Fulbright US LLP; Gerard Messina

(57) ABSTRACT

A method for updating a control device having a first processor core and having a first flash memory associated with the first processor core, in which the first processor core works with a first block of the first flash memory, in which while it is working, a second block, electronically separate from the first block, of the first flash memory is reprogrammed with a predefined memory image; and in which after reprogramming, the first processor core is switched over from the first block of the first flash memory to the second block of the first flash memory.

9 Claims, 2 Drawing Sheets

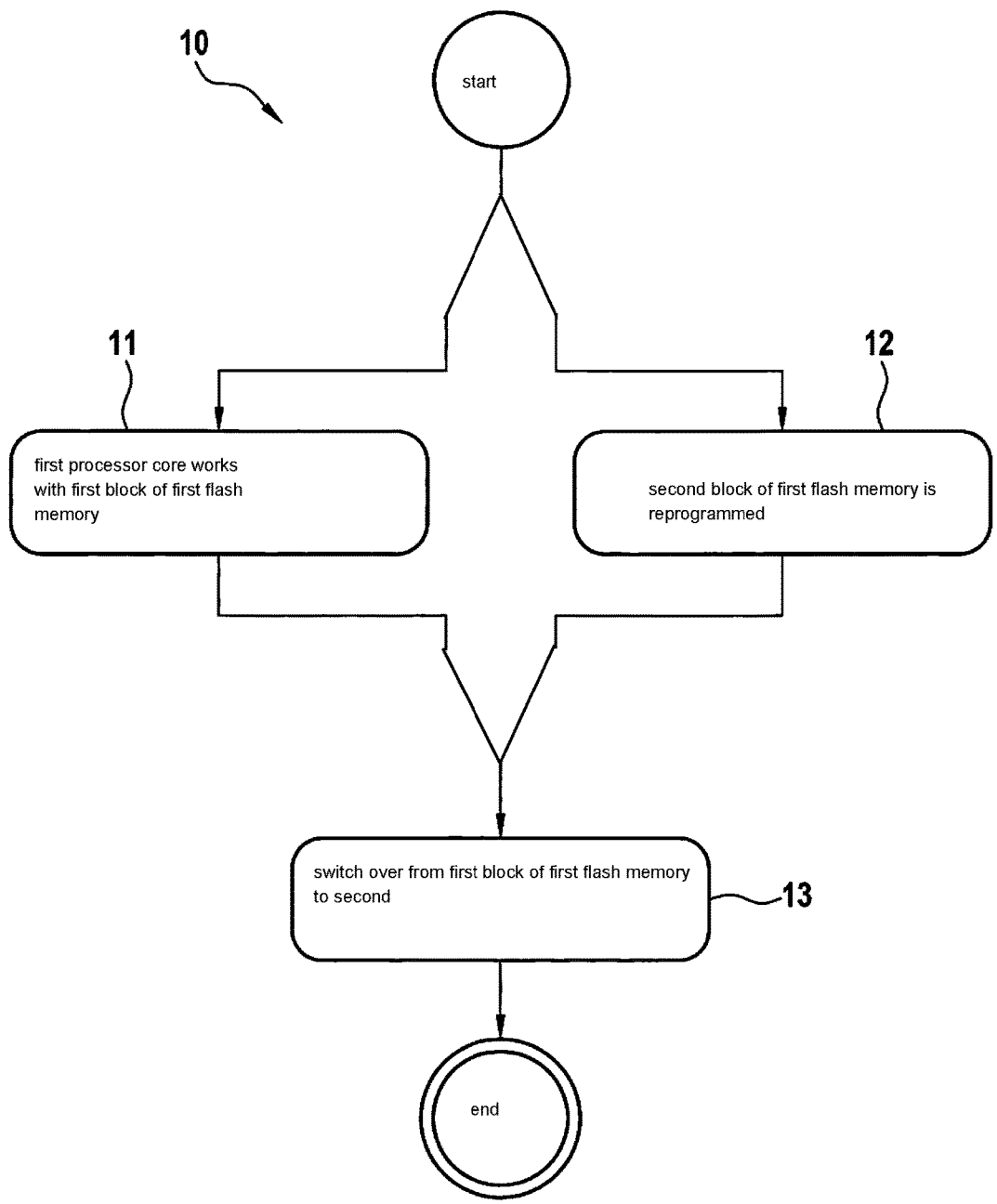

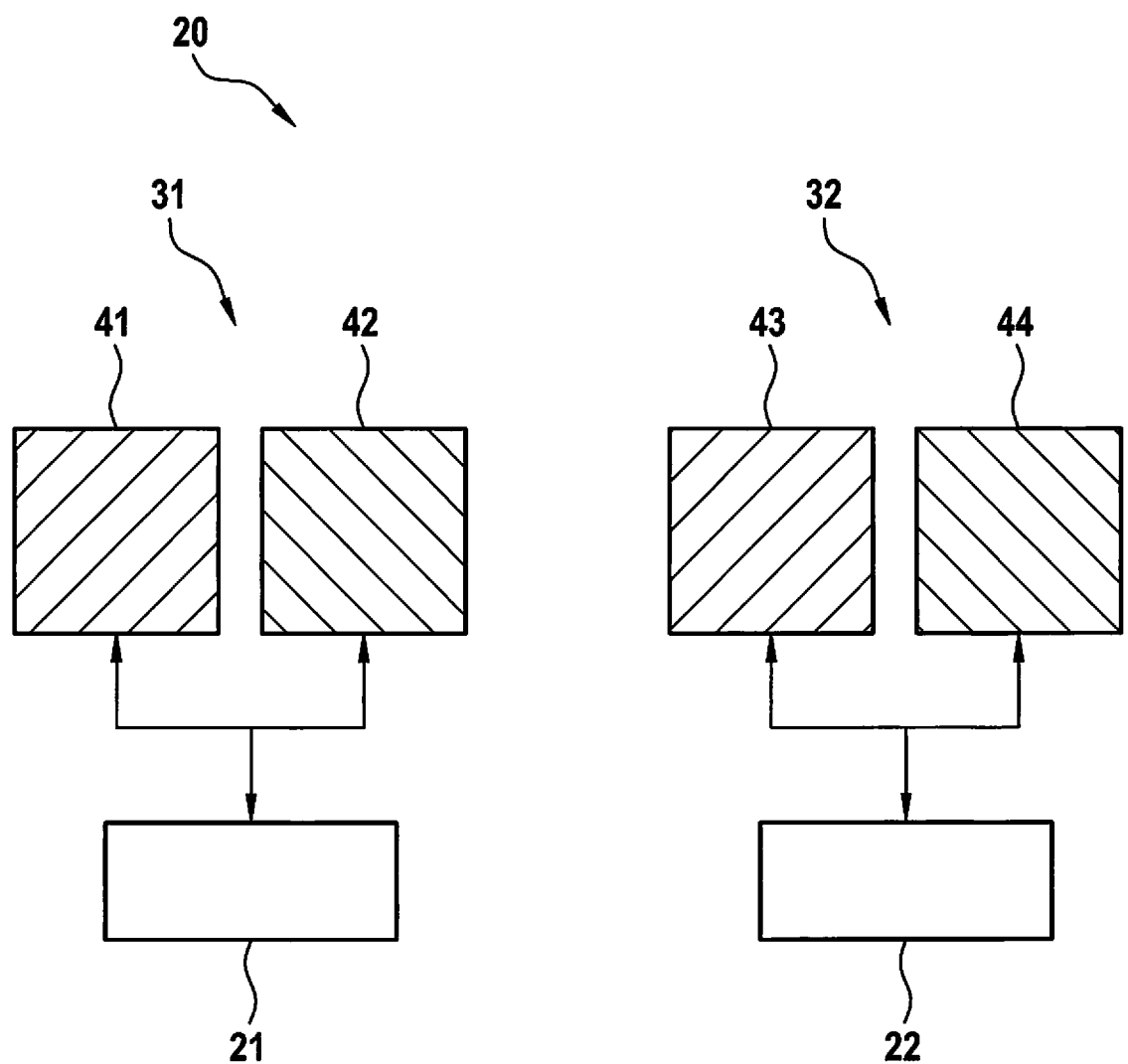

METHOD AND APPARATUS FOR UPDATING A CONTROL DEVICE

RELATED APPLICATION INFORMATION

The present application claims priority to and the benefit of German patent application no. 10 2015 219 841.3, which was filed in Germany on Oct. 13, 2015, the disclosure of which is incorporated herein by reference.

FIELD OF THE INVENTION

The present invention relates to a method for updating a control device. The present invention furthermore relates to a corresponding apparatus, to a corresponding computer program, and to a corresponding (non-transitory) memory medium.

BACKGROUND INFORMATION

The term "control device" refers to any electronic module (electronic control unit (ECU), electronic control module (ECM)) that is installed directly at utilization locations at which open- or closed-loop control is necessary. Control devices serve to control motor vehicles, machines, systems, and a wide variety of technical processes. In the context of present-day combustion engines, mechanical regulation concepts have been almost entirely displaced by electronic control units.

A control device corresponding to the existing art is made up of a standalone computer in the form of an embedded system. The size of this computer varies considerably depending on the complexity of its tasks, and ranges from single-chip solutions having a microcontroller with built-in RAM and ROM memory to multi-processor systems having a flash memory whose contents can be updated, for example, in a qualified technical service facility.

DE 10 2011 117376 A1 discloses a method for accepting program data via telematics into a control device of a motor vehicle. The method according to the present invention encompasses transferring new program data via mobile radio to a first memory region of a first control device, transferring the new program data to a destination control device, and automatically checking the functionality of the destination control device before the motor vehicle is enabled again.

SUMMARY OF THE INVENTION

The invention furnishes a method for updating a control device, a corresponding apparatus, a corresponding computer program, and a corresponding memory medium, in accordance with the description herein.

An advantage of the solution advocated here is that a startup delay cannot occur, and that if necessary it is possible to work with the old (previously functional) memory image of the flash memory.

The features set forth in the further descriptions herein make possible advantageous refinements of and improvements to the basic idea described in the description herein. For example, provision can be made that if the memory image fails, the first processor core is switched over from the second block of the first flash memory to the first block of the first flash memory. If the control device is controlling a vehicle engine, this switchover allows engine function to be maintained if the memory image of a block in the overall vehicle system is not functional. Exemplifying embodiments of the invention are depicted in the drawings and explained in further detail in the description below.

BRIEF DESCRIPTION OF THE DRAWINGS

FIG. 1 shows the activity diagram of a method according to a first embodiment of the invention.

FIG. 2 schematically shows a control device according to a second embodiment of the invention.

DETAILED DESCRIPTION

FIG. 1 illustrates a method for updating a vehicle control device according to an embodiment of the invention whose design features are reflected in FIG. 2. In accordance therewith, control device 20 is equipped with a first processor core 21, a second processor core 22, a first flash memory 31, and a second flash memory 32. First flash memory 31 is local or remote with respect to first processor core 21, but is in any case associated therewith. Second processor core 22 is correspondingly associated with second flash memory 32.

First flash memory 31 is embodied in the form of two separate blocks 41, 42 (having dedicated word line drivers and read amplifiers). Second flash memory 32 is also analogously embodied in the form of two separate blocks 43, 44. The respective first block 41, 43 contains a first memory image, while the respective second block 42, 44 contains a second memory image. It is understood that one central flash memory can also be utilized instead of two local flash memories 31, 32, or a respective division into more than two blocks can occur, without departing from the context of the invention.

During normal operation of control device 20 as depicted in FIG. 2, first processor core 21 works predominantly locally with first flash memory 31 while second processor core 22 is operated predominantly locally with second flash memory 32. The matter of which block 41, 42, 43, 44 of first processor core 21 and second processor core 22 is respectively worked with (reference number 11) can remain undefined.

While the relevant application is performing its duty, it is programming (reference character 12) the respective second block 42, 44 with the current memory image—in the background, so to speak, while the engine is running. Second block 42 of first flash memory 31 and second block 44 of second flash memory 32 can thus be erased during operation of the engine, and reprogrammed via the "over-the-air" (OTA) interface of the vehicle.

After reprogramming 12, first processor core 21 of first block 41 of first flash memory 31 is switched over to second block 42 of first flash memory 31, while second processor core 22 in turn is switched over from first block 43 of second flash memory 32 to second block 44 of second flash memory 32 (reference character 13). After this switchover 13, the respective first blocks 41, 43 can also be programmed with another memory image.

This method 10 can be implemented in control device 20, for example, in software or in hardware or in a mixed form made up of software and hardware.

What is claimed is:

1. A method for updating a control device having a first processor core and having a first flash memory associated with the first processor core, the method comprising:
   providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein if the memory image fails, the first processor core is switched over from the second block of the first flash memory to the first block of the first flash memory.

2. The method of claim 1, wherein updating is accomplished via an over-the-air interface.

3. A method for updating a control device having a first processor core and having a first flash memory associated with the first processor core, the method comprising:

providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein a second processor core of the control device works with a first block of a second flash memory associated with the second processor core, and wherein while the second processor core is working, a second block, electronically separate from the first block, of the second flash memory is reprogrammed; and wherein after the reprogramming, the second processor core is switched over from the first block of the second flash memory to the second block of the second flash memory.

4. A method for updating a control device having a first processor core and having a first flash memory associated with the first processor core, the method comprising:

providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein the switchover occurs when the control device is restarted.

5. The method of claim 4, wherein after starting, an address image of the control device is selectably modified or retained.

6. The method of claim 4, wherein the control device controls an engine of a motor vehicle, and wherein the control device is started with the engine.

7. A non-transitory memory medium having a computer program, which is executable by a processor, comprising:

a program code arrangement having program code for updating a control device having a first processor core and having a first flash memory associated with the first processor core, by performing the following:

providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein the switchover occurs when the control device is restarted.

8. A non-transitory memory medium having a computer program, which is executable by a processor, comprising:

a program code arrangement having program code for updating a control device having a first processor core and having a first flash memory associated with the first processor core, by performing the following:

providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein if the memory image fails, the first processor core is switched over from the second block of the first flash memory to the first block of the first flash memory.

9. An apparatus for updating a control device having a first processor core and having a first flash memory associated with the first processor core, comprising:

an updating arrangement configured to perform the following:

providing that the first processor core works with a first block of the first flash memory;

reprogramming, while the first processor core is working, a second block, electronically separate from the first block, of the first flash memory with a predefined memory image; and switching over, after reprogramming, the first processor core from the first block of the first flash memory to the second block of the first flash memory;

wherein the switchover occurs when the control device is restarted.

* * * * *